United States Patent
Yamamoto et al.

(10) Patent No.: US 12,435,424 B2
(45) Date of Patent: Oct. 7, 2025

(54) RAW MATERIAL SUPPLY SYSTEM, SUBSTRATE PROCESSING APPARATUS, AND METHOD OF MANUFACTURING SEMICONDUCTOR DEVICE

(71) Applicant: Kokusai Electric Corporation, Tokyo (JP)

(72) Inventors: Kaoru Yamamoto, Toyama (JP); Kentaro Goshima, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 411 days.

(21) Appl. No.: 18/177,615

(22) Filed: Mar. 2, 2023

(65) Prior Publication Data

US 2023/0279551 A1 Sep. 7, 2023

(30) Foreign Application Priority Data

Mar. 4, 2022 (JP) ................................. 2022-033249
Feb. 27, 2023 (JP) ................................. 2023-027912

(51) Int. Cl.
*C23C 16/448* (2006.01)
*C23C 16/455* (2006.01)
*C23C 16/458* (2006.01)
*C23C 16/52* (2006.01)
*H01L 21/02* (2006.01)

(52) U.S. Cl.
CPC ............ *C23C 16/52* (2013.01); *C23C 16/448* (2013.01); *C23C 16/45561* (2013.01); *C23C 16/4584* (2013.01); *H01L 21/02126* (2013.01); *H01L 21/02164* (2013.01); *H01L 21/0217* (2013.01)

(58) Field of Classification Search
None
See application file for complete search history.

(56) References Cited

U.S. PATENT DOCUMENTS

| | | | |
|---|---|---|---|
| 2015/0176153 A1* | 6/2015 | Chang | C23C 16/448 137/487 |
| 2019/0096663 A1 | 3/2019 | Ogawa et al. | |
| 2019/0249299 A1* | 8/2019 | Park | C23C 16/4485 |
| 2023/0021102 A1* | 1/2023 | Sugita | G05D 7/0647 |

FOREIGN PATENT DOCUMENTS

JP 2018-090834 A 6/2018

* cited by examiner

*Primary Examiner* — Cory W Eskridge
(74) *Attorney, Agent, or Firm* — Volpe Koenig

(57) ABSTRACT

There is provided a configuration that includes: a first gas supply line configured to be capable of controlling a flow rate of a first precursor gas, which is generated by a first raw material, by a flow rate controller, and supplying the first precursor gas into the process chamber; and a second gas supply line configured to be capable of supplying a second precursor gas, which is generated by a second raw material, into the process chamber, wherein a flow rate of the second precursor gas is determined based on a pressure difference between a primary-side pressure of the flow rate controller installed at the first gas supply line and a supply pressure of the second precursor gas from the second gas supply line into the process chamber.

18 Claims, 13 Drawing Sheets

FIG. 9

|  | Film-forming process 1 | Film-forming process 2 | Film-forming process 3 | Film-forming process 4 |
|---|---|---|---|---|
| First precursor gas | ○ | | | |
| Second precursor gas | ○ | | | |
| Oxygen-containing gas | | | ○ | |
| $N_2$ (Inert gas) | | ○ | | ○ |

FIG. 10

|  | Film-forming process 1 | Film-forming process 2 | Film-forming process 3 | Film-forming process 4 | Film-forming process 5 | Film-forming process 6 | Film-forming process 7 | Film-forming process 8 |
|---|---|---|---|---|---|---|---|---|
| First precursor gas | O |  |  |  |  |  |  |  |
| Second precursor gas |  |  |  |  | O |  |  |  |
| Oxygen-containing gas |  |  | O |  |  |  | O |  |
| N₂ (Inert gas) |  | O |  | O |  | O |  | O |

RAW MATERIAL SUPPLY SYSTEM, SUBSTRATE PROCESSING APPARATUS, AND METHOD OF MANUFACTURING SEMICONDUCTOR DEVICE

CROSS-REFERENCE TO RELATED APPLICATION

This application is based upon and claims the benefit of priority from Japanese Patent Application No. 2022-033249, filed on Mar. 4, 2022, and Japanese Patent Application No. 2023-027912, filed on Feb. 27, 2023, the entire contents of which are incorporated herein by reference.

TECHNICAL FIELD

The present disclosure relates to a raw material supply system, a substrate processing apparatus, and a method of manufacturing a semiconductor device.

BACKGROUND

In the related art, a semiconductor manufacturing apparatus that is configured to manufacture a semiconductor device is known as an example of a substrate processing apparatus. For example, substrate processing is performed in which a process gas is supplied into a reaction tube to process a substrate (hereinafter also referred to as a "wafer") under predetermined process conditions. In recent years, various process gases, such as gases obtained by vaporizing liquids and gases obtained by sublimating solids, are used.

Generally, process gases generated from raw materials with different characteristics are generated and supplied by different systems respectively. Further, within the same supply system, a plurality of process gases are supplied by valve switching in consideration of a pressure on a secondary side of a supply valve. However, it may be difficult to stably supply the gases at constant flow rate due to an influence (interference) of fluctuations in the pressure on the secondary side of the valve.

SUMMARY

Some embodiments of the present disclosure provide a technique that is capable of supplying a plurality of raw materials with one raw material supply system.

According to some embodiments of the present disclosure, there is provided a configuration that includes: a first gas supply line configured to be capable of controlling a flow rate of a first precursor gas, which is generated by a first raw material, by a flow rate controller, and supplying the first precursor gas into the process chamber; and a second gas supply line configured to be capable of supplying a second precursor gas, which is generated by a second raw material, into the process chamber, wherein a flow rate of the second precursor gas is determined based on a pressure difference between a primary-side pressure of the flow rate controller installed at the first gas supply line and a supply pressure of the second precursor gas from the second gas supply line into the process chamber.

BRIEF DESCRIPTION OF DRAWINGS

The accompanying drawings, which are incorporated in and constitute a part of the specification, illustrate embodiments of the present disclosure.

FIG. 9 is an example flowchart of a substrate processing process according to the embodiments of the present disclosure.

FIG. 10 is an example flowchart of a substrate processing process according to the embodiments of the present disclosure.

DETAILED DESCRIPTION

Reference will now be made in detail to various embodiments, examples of which are illustrated in the accompanying drawings. In the following detailed description, numerous specific details are set forth to provide a thorough understanding of the present disclosure. However, it will be apparent to one of ordinary skill in the art that the present disclosure may be practiced without these specific details. In other instances, well-known methods, procedures, systems, and components are not described in detail so as not to unnecessarily obscure aspects of the various embodiments.

Figure 1:
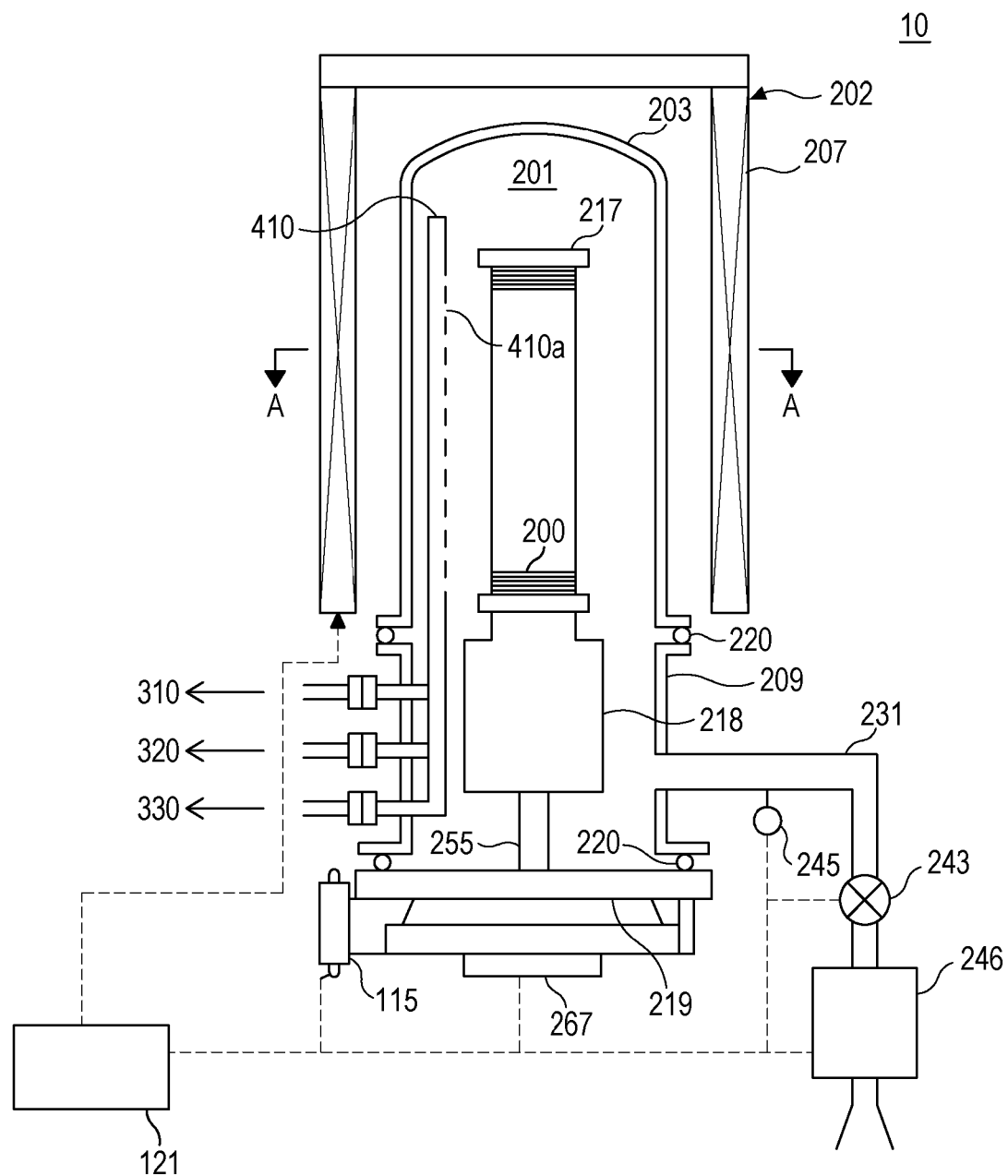
FIG. 1 is a longitudinal sectional view showing a schematic structure of a process furnace of a substrate processing apparatus according to some embodiments of the present disclosure.

As shown in FIG. 1, a process furnace 202 includes a heater 207 as a heating means or unit (heating mechanism). The heater 207 is formed in a cylindrical shape and is supported by a heater base (not shown) as a support plate to be vertically installed.

A reaction tube 203 forming a reaction container (process container) is disposed inside the heater 207 to be concentric with the heater 207. The reaction tube 203 is made of heat resistant material (for example, quartz ($SiO_2$), silicon carbide (SiC), or the like), and is formed in a cylindrical shape with its upper end closed and its lower end opened. A process chamber 201 is configured such that wafers 200 as substrates may be accommodated in a boat 217 described below in a horizontal posture and with the wafers 200 vertically aligned in multiple stages.

First to third nozzles 410, 420, and 430 are installed in the process chamber 201 to penetrate through a side wall of a manifold 209. First to third gas supply pipes 310, 320, and 330 as gas supply lines are connected to the nozzles 410, 420, and 430, respectively. In this way, the reaction tube 203 is provided with three nozzles 410, 420, and 430 and the gas supply pipes 310, 320, and 330 such that a plurality of types of gases (process gases) may be supplied into the process chamber 201.

However, the process furnace 202 of the embodiments of the present disclosure is not limited to the above-described form. For example, a metal manifold that supports the reaction tube 203 may be provided below the reaction tube 203, and each nozzle may be installed to penetrate the side wall of the manifold. In this case, the manifold may be further provided with an exhaust pipe 231 described below. Even in this case, the exhaust pipe 231 may be installed below the reaction tube 203 instead of the manifold. In this way, a furnace opening of the process furnace 202 may be made of metal, and a nozzle or the like may be attached to the metal furnace opening.

An O-containing gas as a reaction gas (reactant) containing oxygen (O) is supplied as a process gas from the gas supply pipe 310 into the process chamber 201 via the nozzle 410. A metal-element-free O-containing gas may be used as the O-containing gas.

A N-containing gas as a reaction gas (reactant) containing nitrogen (N) is supplied as a process gas from the gas supply pipe 320 into the process chamber 201 via the nozzle 420. A metal-element free N-containing gas may be used as the N-containing gas.

A raw material gas (hereinafter, simply referred to as a precursor gas), which is obtained by sublimating a solid-state raw material (solid raw material) under a condition of normal temperature and pressure, is supplied as a process gas from the gas supply pipe 330 into the process chamber 201. As described below, a solid raw material containing a plurality of metal elements is supplied from the gas supply pipe 330 into the process chamber 201. As the solid raw material, for example, a halogen-based raw material (also referred to as a halide raw material), which is a metal raw material containing a metal element and containing no carbon (C), that is, an inorganic metal-based raw material (inorganic metal compound), is used. Further, as described below, together with the first precursor gas, a raw material gas (second precursor gas), which is obtained by sublimating a second solid raw material that is lower in a vapor pressure than a first solid raw material, may be respectively supplied as a first process gas from the gas supply pipe 330 to the process chamber 201. Further, in the embodiments of the present disclosure, a raw material supply system 100, which will be described later, configured to be capable of supplying a raw material containing a plurality of metal elements is connected to the gas supply pipe 330.

Here, in a case where the material contains the same element (for example, a halogen element) in a predetermined element (for example, metal) that forms a nucleus of the solid raw material, one raw material supply line may be used. For example, even in a case where the material contains the same element (for example, a halogen element) in the predetermined element other than metal (other than the solid raw material), the material may be added to one raw material supply line. However, a condition that the same raw material supply line may be constructed is that: (1) a pipe temperature of the common portion is equal to or below the thermal decomposition temperature of both materials, and (2) the respective raw materials do not react with each other. In a case where such a condition is satisfied, a raw material supply line configured to supply a raw material containing an element other than the solid raw material, for example, a silicon (Si) element, may be included in FIG. 4 to be described later.

Figure 2:
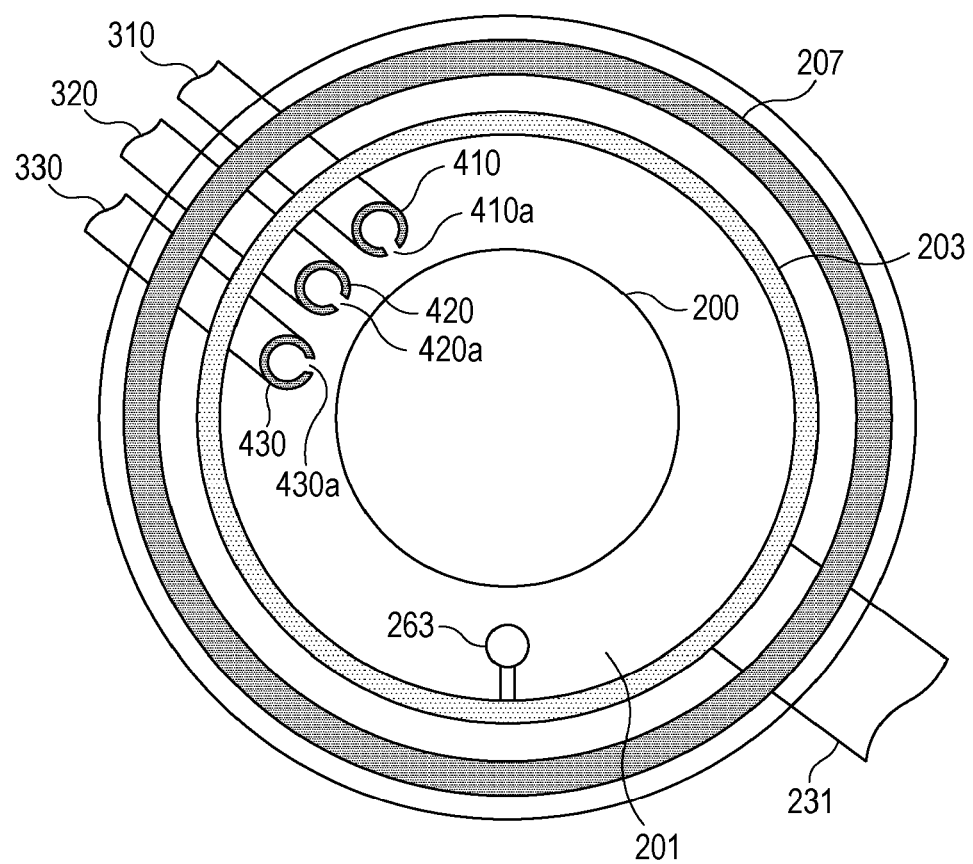
FIG. 2 is a schematic cross-sectional view taken along line A-A in FIG. 1.
Figure 3:
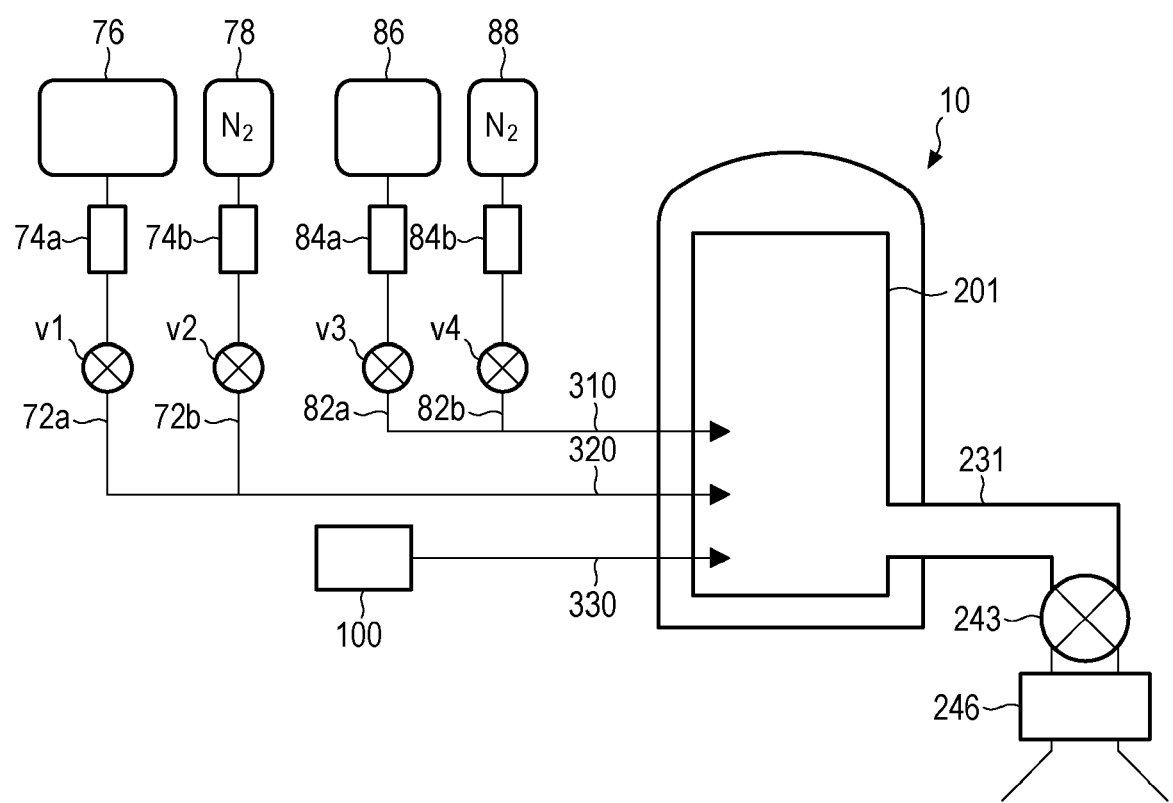
FIG. 3 shows a schematic view of a peripheral structure of a process furnace of a substrate processing apparatus according to the embodiments of the present disclosure.

As shown in FIG. 2, the nozzles 410, 420, and 430 are connected to the leading ends of the gas supply pipes 310, 320, and 330, respectively. Horizontal sides of the nozzles 410, 420, and 430 are installed to penetrate the side wall of the manifold 209. Vertical sides of the nozzles 410, 420, and 430 are arranged in an annular space formed between the inner wall of the reaction tube 203 and the wafers 200 so as to extend upward along the inner wall of the reaction tube 203 (upward in the stack direction of the wafers 200) (that is, extend upward from one end side of a wafer arrangement region toward the other end side thereof). Specifically, the nozzles 410, 420, and 430 are installed in a region horizontally surrounding the wafer arrangement region on the lateral side of the wafer arrangement region where the wafers 200 are arranged, along the wafer arrangement region.

First to third gas supply holes 410*a*, 420*a*, and 430*a* configured to supply (eject) gases are formed on the side surfaces of the nozzles 410, 420, and 430, respectively. The gas supply holes 410*a*, 420*a*, and 430*a* are opened to face the center of the reaction tube 203. A plurality of gas supply holes 410*a*, 420*a*, and 430*a* are formed from the lower side to the upper side of the reaction tube 203, each being formed with the same opening area and the same opening pitch. However, the gas supply holes 410*a*, 420*a*, and 430*a* are not limited to the above-described form. For example, the opening area may be gradually increased from the lower side to the upper side of the reaction tube 203. This makes it possible to equalize the flow rates of the gases supplied from the gas supply holes 410*a*, 420*a*, and 430*a*.

In this way, in the embodiments of the present disclosure, the gases are transferred via the nozzles 410, 420, and 430 arranged in a longitudinal annular space formed by the inner wall of the reaction tube 203 and the ends of the plurality of wafers 200, that is, in a cylindrical space. Then, the gases are ejected into the reaction tube 203 for the first time in the vicinity of the wafers 200 from the gas supply holes 410*a*, 420*a*, and 430*a* opened in the nozzles 410, 420, and 430, respectively. The main gas flow in the reaction tube 203 is parallel to the surfaces of the wafers 200, that is, in a horizontal direction. With such a configuration, a gas may be uniformly supplied to each wafer 200, making it possible to improve a film thickness uniformity of a thin film formed on each wafer 200. An after-reaction residual gas flowing on the surface of the wafer 200 flows toward an exhaust port, that is, the exhaust pipe 231 which will be described later. However, a flow direction of the residual gas is appropriately specified depending on the position of the exhaust port, and is not limited to the vertical direction.

The reaction tube 203 is provided with the exhaust pipe 231 configured to exhaust an atmosphere of the process chamber 201. A vacuum pump 246 as a vacuum exhauster is connected to the exhaust pipe 231 via a pressure sensor 245 as a pressure detector (pressure detecting part) configured to detect a pressure of the process chamber 201 and an APC (Auto Pressure Controller) valve 244 as a pressure regulator (pressure regulating part). The APC valve 244 is a valve configured to be capable of performing or stopping a vacuum exhausting operation in the process chamber 201 by opening/closing the valve while the vacuum pump 246 as the exhauster is actuated, and regulating the pressure of the process chamber 201 by adjusting an opening state of the valve based on pressure information detected by the pressure sensor 245 while the vacuum pump 246 is actuated. An exhaust system mainly includes the exhaust pipe 231, the APC valve 244, and the pressure sensor 245. The exhaust system may include the vacuum pump 246.

A seal cap 219, which serves as a furnace opening lid configured to be capable of hermetically sealing a lower end opening of the reaction tube 203, is installed under the reaction tube 203. The seal cap 219 is configured to make contact with the lower side of the reaction tube 203 from below in the vertical direction. The seal cap 219 is made of, for example, metal such as SUS, and is formed in a disc shape. An O-ring 220 as a seal making contact with the lower end of the reaction tube 203 is provided at an upper surface of the seal cap 219.

A rotator 267 configured to rotate the boat 217, which will be described later, is installed at the opposite side of the seal cap 219 from the process chamber 201. A rotary shaft 255 of the rotator 267 is connected to the boat 217 through the seal cap 219. The rotator 267 is configured to rotate the wafers 200 by rotating the boat 217. The seal cap 219 is configured to be vertically moved up or down by a boat elevator 115 as an elevator vertically installed outside the reaction tube 203. The boat elevator 115 is configured to be capable of loading or unloading the boat 217 into or out of the process chamber 201 by moving the seal cap 219 up or down.

The boat 217 serving as a substrate support is configured to support a plurality of wafers 200, for example, 25 to 200 wafers, in such a state that the wafers 200 are arranged in a horizontal posture and in multiple stages along a vertical direction with the centers of the wafers 200 aligned with one another. As such, the boat 217 is configured to arrange the wafers 200 to be spaced apart from each other. The boat 217 is made of, for example, heat resistant material such as quartz or SiC. Heat insulating plates 218 made of, for example, heat resistant material such as quartz or SiC are installed in multiple stages below the boat 217. This configuration makes it difficult for heat from the heater 207 to be transferred to the seal cap 219. However, the embodiments of the present disclosure is not limited to the above-described form. For example, instead of installing the heat insulating plates 218, a heat insulating cylinder formed as a cylinder made of heat resistant material such as quartz or SiC may be installed below the boat 217.

A temperature sensor 263 serving as a temperature detector is installed in the reaction tube 203. Based on temperature information detected by the temperature sensor 263, a state of supplying electric power to the heater 207 is regulated, such that a temperature distribution inside the process chamber 201 becomes a desired temperature distribution. The temperature sensor 263 is formed in an L shape like the nozzles 410, 420, and 430 and is installed along the inner wall of the reaction tube 203.

Next, a peripheral structure of the process furnace 202 of the substrate processing apparatus 10 will be described. The process chamber 201 is provided with the first gas supply pipe 310, the second gas supply pipe 320, and the third gas supply pipe 330.

The first gas supply pipe 310 branches into first branch pipes 82a and 82b at the upstream side. A first raw material gas supply source 86 that supplies, for example, an oxygen gas as a first raw material is connected to the first branch pipe 82a via a valve v3 and a MFC (Mass Flow Controller) 84a as a flow rate controller. A first inert gas supply source 88 that supplies an inert gas such as a nitrogen ($N_2$) as a first inert gas is connected to the first branch pipe 82b via a valve v4 and a MFC 84b. Hereinafter, when simply referring to a pipe branching from the first gas supply pipe 310, it may be generally referred to as a first branch pipe 82, and when simply referring to the MFC installed at the first branch pipe 82, it may be generally referred to a MFC 84. Hereinafter, in the present disclosure, a number may be added in the same manner.

In this way, the first gas supply pipe 310 may introduce a first raw material gas as a first reaction gas or a mixture of the first raw material gas and the inert gas such as $N_2$ into the process chamber 201. For example, a first raw material gas supply system mainly includes the first gas supply pipe 310, the first branch pipe 82a, the valve v3, the MFC 84a, and the first raw material gas supply source 86.

The second gas supply pipe 320 branches into second branch pipes 72a and 72b at the upstream. A nitriding gas supply source 76 that supplies a nitriding gas as a second raw material gas is connected to the second branch pipe 72a via a valve v1 and a MFC 74a. A second inert gas supply source 78 that supplies an inert gas such as $N_2$ as a second inert gas is connected to the second branch pipe 72b via a valve v2 and a MFC 74b. Hereinafter, when simply referring to a pipe branching from the second gas supply pipe 320, it may be generically referred to as a second branch pipe 72, and when simply referring to a MFC installed at the second branch pipe 72, it may be generically referred to as a MFC 74.

In this way, the second gas supply pipe 320 introduces the second raw material gas as a second reaction gas or the second raw material gas and the inert gas such as $N_2$ into the process chamber 201. A nitriding gas supply system mainly includes the second gas supply pipe 320, the second branch pipe 72a, the valve v1, the MFC 84a, and the nitriding gas supply source 76.

The inert gas which is supplied from the first inert gas supply source 88 and the second inert gas supply source 78 may be used. These gases may act as a purge gas, a dilution gas, or a carrier gas in a substrate processing process which will be described later. Further, each of the first gas supply pipe 310, the second gas supply pipe 320, and the third gas supply pipe 330 may be provided with a vent pipe configured to discharge a gas to the outside.

A controller 121 (not shown) is electrically connected to components such as the valves v1 to v4, the MFC 74, the MFC 84, the APC valve 243, and the exhauster 246. The controller 121 controls these components at desired timings such that a flow rate of a gas to be supplied, the pressure of the process chamber 201, and the like become predetermined values. Here, the MFC 74 and the MFC 84 are generic names of the MFCs 74a and 74b and the MFC 84a and 84b, respectively.

Figure 4:
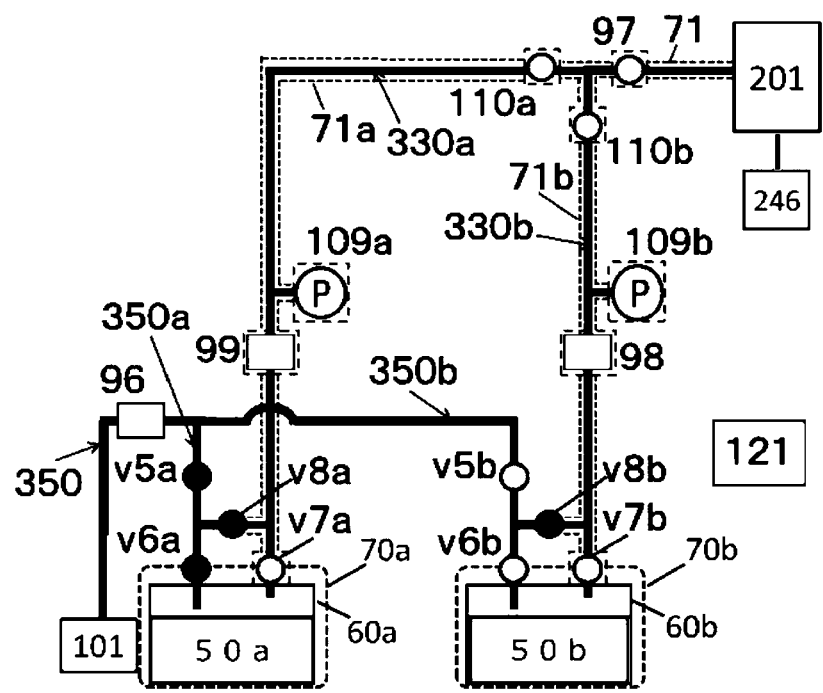
FIG. 4 is a schematic view showing a raw material supply system of substrate processing apparatus according to the embodiments of the present disclosure.

The raw material supply system 100 shown in FIG. 4 is connected to the third gas supply pipe 330. Hereinafter, the raw material supply system 100 connected to the third gas supply pipe 330 according to the embodiments of the present disclosure will be specifically described with reference to FIG. 4.

The raw material supply system 100 is configured to include a first precursor gas supply system 100a in which a first solid raw material 50a is placed in a first raw material container 60a and a gas (which hereinafter may be referred to as a first precursor gas) obtained by sublimating the first solid raw material 50a by heating the first raw material container 60a is supplied into the process chamber 201 via the third gas supply pipe 330, and a second precursor gas supply system 100b in which a second solid raw material 50b is placed in a second raw material container 60b and a gas (which hereinafter may be referred to as a second precursor gas) obtained by sublimating the second solid raw material 50b by heating the second raw material container 60b is supplied into the process chamber 201 via the third gas supply pipe 330.

As shown in FIG. 4, the first precursor gas supply system 100a and the second precursor gas supply system 100b are configured to include the common gas supply pipe 330 and the nozzle 430 from an opening/closing valve 97 (hereinafter also referred to as a final valve FV) as an opener/closer up to the process chamber 201. In other words, the opening/closing valve 97 is a component installed at the gas supply pipe 330 and at a position closest to the process chamber 201. A line from the first raw material container 60a to the opening/closing valve 97 may be referred to as a first solid raw material supply line (first precursor gas supply line), and a line from the second raw material container 60b to the opening/closing valve 97 may be referred to as a second solid raw material supply line (second precursor gas supply line).

Further, in the embodiments of the present disclosure, since the first solid raw material 50a and the second solid raw material 50b are different in vapor pressure characteristics from each other, different structures and raw material supply methods are employed. For example, supply control methods are divided such that a self-sublimation method is used for the first solid raw material 50a being relatively high in a vapor pressure and a carrier gas flow method is used for the second solid raw material 50b being extremely low in the vapor pressure. The self-sublimation method is also called a so-called vapor draw method and is a method of generating the first precursor gas by causing a phase change from a solid by heating the first raw material container 60a by a tank heater (hereinafter referred to as a first sub-heater) 70a as a sub-heater. Although not shown, this first precursor gas may be appropriately mixed with a carrier gas at an outlet of the first raw material container 60a. In this method, no carrier gas is supplied into the first raw material container 60a. The carrier gas flow method is a method of generating the second precursor gas by causing a phase change from a solid by supplying a carrier gas with its flow rate regulated by an MFC 96 to the second raw material container 60b via a second introduction pipe 350b while heating the second raw material container 60b by a second tank heater (hereinafter referred to as a second sub-heater) 70b as a sub-heater. Although not shown in FIG. 4, this carrier gas may be heated in advance to a temperature equal to or higher than the temperature at which the phase of the second solid raw material 50b changes.

In the embodiments of the present disclosure, a first raw material supply line configured to be capable of supplying a gas obtained by sublimating the first solid raw material 50a, with its flow rate regulated by a MFC 99, into the process chamber 201 and a second raw material supply line configured to be capable of supplying a gas obtained by sublimating the second solid raw material 50b into the process chamber 201 are provided, and a flow rate of the gas obtained by sublimating the second solid raw material 50b, which is supplied to the second raw material supply line, is determined by a pressure difference between a primary-side pressure and a secondary-side pressure of the MFC 99 installed at the first raw material supply line. Although the details will be described later, in this case, the gases obtained by sublimating the first solid raw material 50a and the second solid raw material 50b respectively, (the first precursor gas and the second precursor gas), may be simultaneously supplied into the process chamber 201. That is, the gases obtained by sublimating the first solid raw material 50a and the second solid raw material 50b respectively, may be mixed in the gas supply pipe 330 and then supplied into the process chamber 201 via the nozzle 430.

(Opening/Closing Valve 97)

The opening/closing valve 97 is a valve configured to supply the first precursor gas and the second precursor gas (the gases obtained by sublimating the first solid raw material 50a and the second solid raw material 50b, respectively) into the process chamber 201, and the first raw material supply line and the second raw material supply line are connected immediately before the opening/closing valve 97. Specifically, the above-described "immediately before" means that a place (pipe) that branches into the first raw material supply line and the second raw material supply line is provided close to the opening/closing valve 97. Further, the opening/closing valve 97 may be installed as close to the process chamber 201 as possible. Thus, an influence of mutual interference between the first raw material supply line and the second raw material supply line may be suppressed.

(Structure of First Solid Raw Material Supply Line)

The first precursor gas supply system 100a is configured to include the first solid raw material supply line, the opening/closing valve 97, and a pipe from the opening/closing valve 97 to the process chamber 201. Hereinafter, the first solid raw material supply line will be described with reference to FIG. 4.

The first solid raw material supply line is configured such that the first raw material supply pipe 330a is provided with a first supply valve 110a, a pressure gauge 109a as a pressure sensor, the MFC 99, a valve v7a, and the first raw material container 60a toward the upstream from the opening/closing valve 97 and a first sub-heater 70a is installed to surround the first raw material container 60a such that the first sub-heater 70a may heat the first raw material container 60a. By the heating of the first sub-heater 70a, the first solid raw material 50a in the first raw material container 60a is heated to a temperature which is equal to or higher than a temperature at which the first solid raw material 50a is transformed into a gaseous state.

Further, the first solid raw material supply line includes a first pipe heater 71a as a pipe heater configured to heat the first raw material supply pipe 330a, the MFC 99, a pressure gauge 109 as a pressure sensor, and the opener/closer 97, respectively, and is controlled in temperature to be equal to or higher than a vaporization state temperature of the first solid raw material 50a. Further, the first pipe heater 71a may be controlled to a temperature higher than that of the first raw material container 60a to suppress a state transformation of the first precursor gas from the gaseous state.

Further, a first introduction pipe 350a is connected to the upstream side of the first raw material container 60a, and an introduction valve v5a and a primary valve v6a are installed at the first introduction pipe 350a. Further, a MFC 96 is installed at the upstream side of the introduction pipe 350a and is connected to an inert gas source 101. Further, the MFC 96 and the inert gas source 101 are shared with a second introduction pipe 350b which will be described later. Further, since a valve v8a is installed at a bypass line and an inert gas may be supplied into the first raw material supply pipe 330a without passing through the first raw material container 60a, the inside of the first raw material supply pipe 330a may be purged. The first introduction pipe 350a, the bypass line, the introduction valve v5a, the primary valve v6a, and the bypass valve v8a are also included in the first precursor gas supply system 100a.
(MFC)

The MFC 99 of the embodiments of the present disclosure is, for example, a differential pressure type MFC. Further, when the supply pressure of the first precursor gas from the first raw material container 60a as a first raw material source on the upstream side of an orifice is P1 and the pressure on the downstream side of the orifice is P2 (a pressure detected by the pressure sensor 109), in a case where a pressure difference (pressure P2-pressure P1) is within a controllable range, the MFC 99 may keep the flow rate of the first precursor gas constant with respect to a pressure fluctuation in the first raw material container 60a. For example, the pressure P2 is maintained at a pressure value that satisfies a choke flow conditional expression in the orifice of "P1≥2P2." The MFC 99 of the embodiments of the present disclosure is not particularly limited to the above-described differential pressure type MFC, and it goes without saying that it may be, for example, a heat type MFC.

Figure 7:
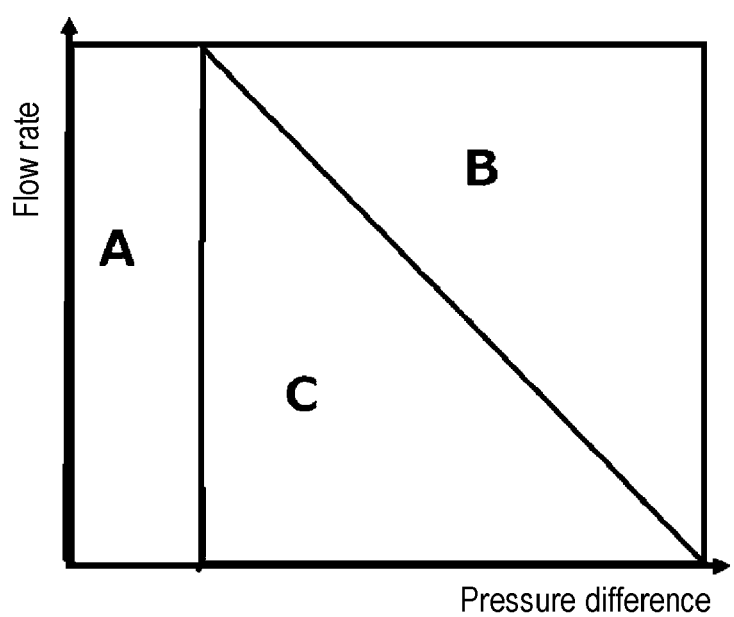
FIG. 7 is a diagram showing characteristics of a flow rate controller according to the embodiments of the present disclosure.

FIG. 7 shows a conceptual diagram of characteristics of the MFC 99. As shown in FIG. 7, a region A is a region where control is impossible due to an insufficient pressure difference (pressure P2-pressure P1), a region B is a region where control is possible, and a region C is a region where control is possible but there is a risk of particles occurrence (a region where a gas is likely to be transformed into a solid).

In the embodiments of the present disclosure, by controlling the pressures on the primary side and the secondary side of the MFC 99, it is possible to regulate under conditions of the region B of the MFC 99 such that a control limit value of the MFC 99 is not exceeded. Thus, the first precursor gas may be supplied into the process chamber 201 without undergoing a phase change (solidification in the case of the solid raw material). As a result, the first precursor gas may be spread over the surface of the wafer 200, thereby improving an in-plane film thickness uniformity of the single wafer 200 and a film thickness uniformity among the wafers 200. A plurality of MFCs 99 may be installed in parallel. Thus, the flow rate of the first precursor gas that may be supplied from the MFCs 99 may be increased.

In the embodiments of the present disclosure, as shown in FIG. 4, while the first precursor gas is being supplied into the process chamber 201, the introduction valve v5a, the primary valve v6a, and the bypass valve v8a remain closed. Further, the inert gas source 101 is connected to the first raw material container 60a via these valves v5a and v6a. This is because the embodiments of the present disclosure may apply to a case where the vapor pressure of the first solid raw material 50a may be the same as that of the second solid raw material 50b, as well as a case where the first solid raw material 50a and the second solid raw material 50b are different in the vapor pressure from each other. In other words, the method of supplying the first precursor gas and the method of supplying the second precursor gas may be the same. Further, although two solid raw material supply lines are shown in FIG. 4, there is no reason for the two, and there may be three or more solid raw material supply lines.

(Operation of First Solid Raw Material Supply Line)

FIG. 4 shows a state in which the first precursor gas is supplied into the process chamber 201. In this operation, the introduction valve v5a, the primary valve v6a, and the bypass valve v8a are in a closed state, and the secondary valve v7a, the first supply valve 110a, and the opening/closing valve 97 are in an opened state. The controller 121 is configured to supply the gas (the first precursor gas), which is obtained by sublimating the first solid raw material 50a by causing the first sub-heater 70a to heat the first solid raw material 50a in the first raw material container 60a, into the process chamber 201 while controlling a flow rate of the gas by the MFC 99. The controller 121 is configured to stop the supply of the first precursor gas by closing the secondary valve v7a or the first supply valve 110a.

(Structure of Second Solid Raw Material Supply Line)

Next, the second solid raw material supply line will be described with reference to FIG. 4. The second precursor gas supply system 100b is configured to include at least the second solid raw material supply line, the opening/closing valve 97, and the pipe from the opening/closing valve 97 to the process chamber 201. In the second solid raw material supply line, a second supply valve 110b, a pressure gauge 109b as a pressure sensor, a mass flow meter (MFM) 98 as a flow rate monitor, a valve v7b, and the second raw material container 60b are installed at the second raw material supply pipe 330b toward the upstream side from the opening/closing valve 97.

A second sub-heater 70b is installed such that the second sub-heater 70b may surround and heat the second raw material container 60b. By the heating of the second sub-heater 70b, the second solid raw material 50b in the second raw material container 60b is heated to a temperature which is equal to or higher that a temperature at which the second solid raw material 50b is transformed into a gaseous state. Further, the second solid raw material supply line includes a second pipe heater 71b as a pipe heater configured to heat the second raw material supply pipe 330b, the MFM 98, the pressure sensor 109b, and the opener/closer 97, respectively, and is controlled in temperature to be equal to or higher than a vaporization state temperature of the second solid raw material 50b. Further, the second pipe heater 71b may be controlled to a temperature higher than that of the second raw material container 60b to suppress the phase transformation of the second precursor gas from the gaseous state.

Further, the second introduction pipe 350b is connected to the upstream side of the second raw material container 60b, and is provided with an introduction valve v5b and a primary valve v6b. Further, the MFC 96 is installed at the upstream side of the second introduction pipe 350b and is connected to the inert gas source 101. Further, since a bypass valve v8b may be installed at a bypass line to supply an inert gas into the second raw material supply pipe 330b without passing through the second raw material container 60b, the inside of the second raw material supply pipe 330b may be purged. The second introduction pipe 350b, the bypass line, the introduction valve v5b, primary valve v6b, and the bypass valve v8b are also included in the second precursor gas supply system 100b.

The second introduction pipe 350b as a pressure-feeding gas supply pipe is connected to the second raw material container 60b. The inert gas source 101 as a pressure-feeding gas supply source is connected to the pressure-feeding gas supply pipe 350b via the above-mentioned introduction valve v5b, primary valve v6b, and MFC 96. By supplying a pressure-feeding gas from the pressure-feeding gas supply pipe 350b, the gas (the second precursor gas) sublimated in the second raw material container 60b is introduced from the third gas supply pipe 330 into the process chamber 201. As a carrier gas (hereinafter, referred to as pressure-feeding gas), an inert gas that does not react with the raw material may be used. Since the pressure-feeding gas promotes the sublimation of the second solid raw material 50b, the flow rate of the second precursor gas may be increased by increasing the flow rate of the pressure-feeding gas.

In this way, the second solid raw material supply line introduces the second precursor gas (actually a mixture of the second precursor gas and the pressure-feeding gas) into the process chamber 201. The second solid raw material supply line mainly includes the second raw material supply pipe 330b, the MFM 98, the second raw material container 60b, the pressure-feeding gas supply pipe 350b, the introduction valve v5b, the primary valve v6b, the MFC 96, and the inert gas source 101. (Operation of Second Solid Raw Material Supply Line)

FIG. 4 shows a state in which the second precursor gas is supplied into the process chamber 201. In this operation, the bypass valve v8b is in a closed state, and the introduction valve v5b, the primary valve v6b, the secondary valve v7b, the second supply valve 110b, and the opening/closing valve 97 are in an opened state. The controller 121 is configured to supply a mixture gas of the gas (the second precursor gas), which is obtained by sublimating the second solid raw material 50b by causing the second sub-heater 70b to heat the second solid raw material 50b in the second raw material container 60b, and the pressure-feeding gas, into the process chamber 201 while monitoring the flow rate of the mixture gas by the MFM 98. Further, the supply of the second precursor gas is stopped by closing the secondary valve v7b or the second supply valve 110b. Moreover, at this time, the supply of the pressure-feeding gas may be stopped.

(Monitoring Flow Rate of Second Solid Raw Material Supply Line)

First, on the secondary side (downstream side) of the second raw material container 60b, there is the MFM 98 as the flow rate monitor, but the MFM 98 alone may not perform a flow rate control. Therefore, for the second solid raw material 50b, since an amount of sublimation changes when a pressure on the secondary side (downstream side) changes (for example, the amount of sublimation decreases when the pressure on the secondary side increases), it is possible to appropriately control the flow rate by monitoring the flow rate by the MFM 98 and changing the carrier gas (pressure-feeding gas).

The MFM 98 monitors a mixture gas of the second precursor gas and the carrier gas, but may not directly monitor the flow rate of the second precursor gas. In the embodiments of the present disclosure, the MFC 96 is installed at the primary side, and when a flow rate A is a flow rate supplied by the MFC 96 and a flow rate B is a flow rate monitored by the MFM 98, the following formula is given.

Flow rate of second precursor gas=(Flow rate $B$−Flow rate $A$)×Cf

Here, Cf is a conversion factor of the second precursor gas, but the conversion factor is a value when a conversion factor of a calibration gas of MFC 96 is 1.0.

As a result, in the embodiments of the present disclosure, the flow rate of the second precursor gas may be measured.

Figure 6:
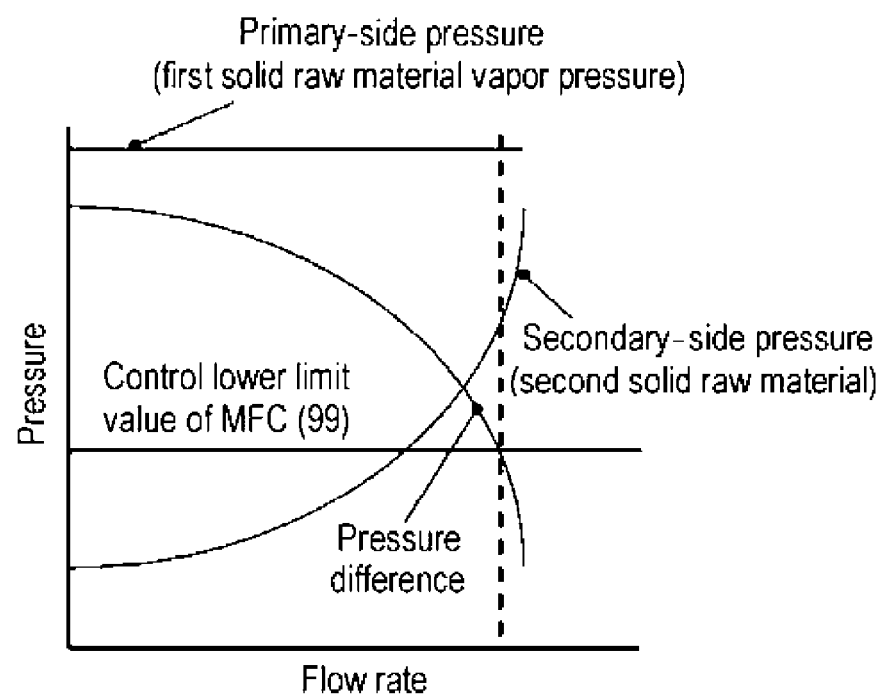
FIG. 6 is a diagram showing a relationship between a primary-side pressure of a flow rate controller and a carrier gas flow rate according to the embodiments of the present disclosure.

FIG. 6 shows a pressure relationship between the first solid raw material supply line and the second solid raw material supply line. The vertical axis represents a pressure, and the horizontal axis represents a gas flow rate, specifically a flow rate of a gas introduced into the second solid raw material supply line to supply the second precursor gas into the process chamber 201. Further, the gas flow rate includes a flow rate of a dilution gas (to be described later) supplied in addition to the carrier gas. In a case where sublimation of the first solid raw material is to be performed, the first sub-heater 70a may be used to raise the temperature. However, as the temperature increases, a risk of solidification and corrosion increases. Therefore, the first sub-heater 70a is controlled so as not to be set to an excessively high temperature and to be close to the sublimation temperature (near a saturated vapor pressure). Therefore, the primary-side pressure of the MFC 99 shown in FIG. 6 is described as approximately a saturated vapor pressure of the first solid raw material 50a.

As shown in FIG. 6, a pressure difference between the secondary-side pressure of the second solid raw material supply line and the primary-side pressure of the first solid raw material supply line is controlled so as not to reach the control limit value of the MFC 99. Although it may be possible to increase the flow rate of the second precursor gas by increasing the flow rate of the gas as described above, in a case where this causes the secondary-side pressure of the first solid raw material supply line to become too large, the pressure difference may reach the control limit value of the MFC 99, making it impossible to supply the first precursor gas. Therefore, the controller 121 is configured to monitor the pressure difference.

Specifically, the controller 121 acquires the supply pressure of the first precursor gas by heating and sublimating the first solid raw material gas in the first solid raw material supply line, calculates the flow rate of the second precursor gas to be supplied to the second gas supply line to acquire the secondary-side pressure of the second solid raw material in the second gas supply line at that time, and checks whether or not a pressure difference between the primary-side pressure of the flow rate controller installed at the first gas supply line (the primary-side pressure of the MFC 99) and the supply pressure of the mixture gas of the second precursor gas and the carrier gas flowing through the second gas supply line (the secondary-side pressure of the second gas supply line) exceeds the control limit value of the MFC 99.

The check by the controller 121 is performed before supplying the first precursor gas or the second precursor gas into the process chamber 201. As a result, a desired amount of the first precursor gas or the second precursor gas may be continuously supplied into the process chamber 201 at the same time.

Figure 5:
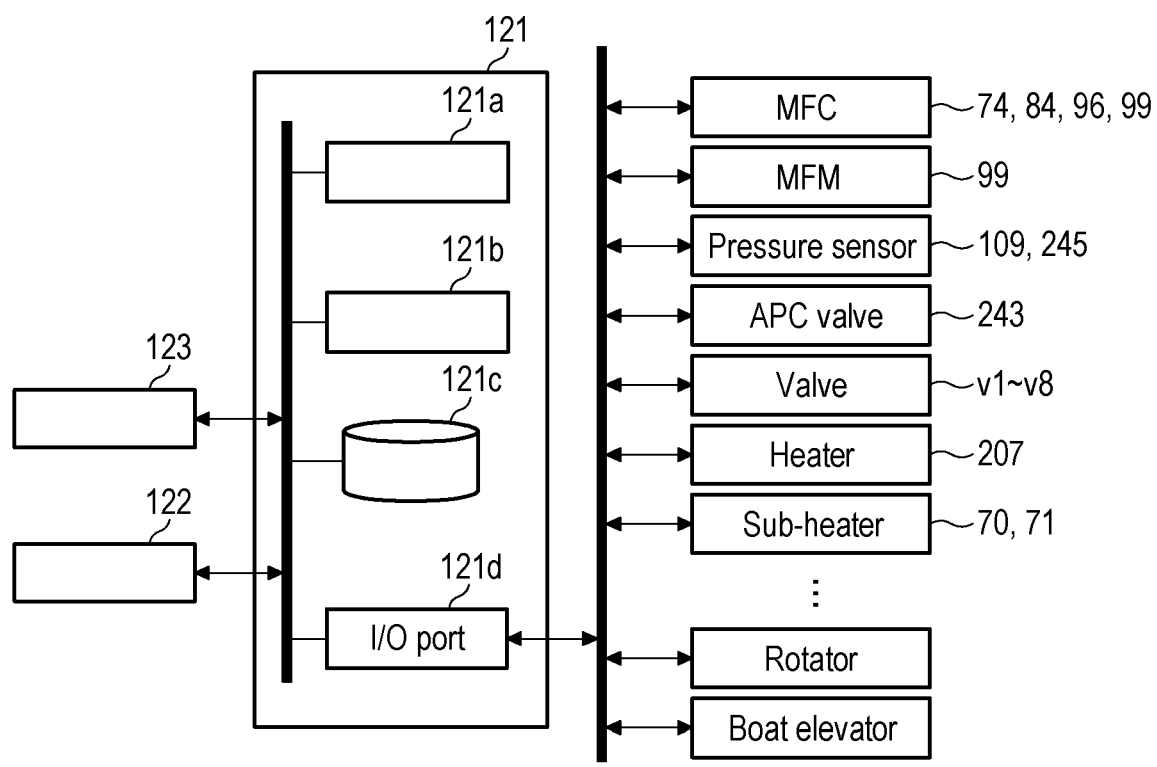
FIG. 5 is a schematic configuration diagram of a controller of a substrate processing apparatus according to the embodiments of the present disclosure, in which a control system of the controller is shown in a block diagram.

As shown in FIG. 5, the controller 121, which is a control part (control means or unit), is constituted as a computer including a central processing unit (CPU) 121a, a random access memory (RAM) 121b, a memory 121c, and an I/O port 121d. The RAM 121b, the memory 121c, and the I/O port 121d are configured to be capable of exchanging data with the CPU 121a via an internal bus. An input/output device 122 including, e.g., a touch panel or the like, is connected to the controller 121.

The memory 121c includes, for example, a flash memory, a hard disk drive (HDD), or the like. A control program that controls operations of a substrate processing apparatus, a process recipe in which sequences and conditions of substrate processing to be described later are written, and the like are readably stored in the memory 121c. The process recipe functions as a program that is combined to cause the controller 121 to execute each sequence in the substrate processing, which will be described later, to obtain an expected result. Hereinafter, the process recipe and the control program may be generally and simply referred to as a "program." When the term "program" is used herein, it may indicate a case of including the process recipe, a case of including the control program, or a case of including both the process recipe and the control program. The RAM 121b is formed as a memory area (work area) in which a program or data read by the CPU 121a is temporarily stored. In the embodiments of the present disclosure, the memory 121c stores at least data indicating a relationship between the control limit range of the flow rate controller shown in FIG. 6 and the pressure difference between the primary-side pressure (the saturated vapor pressure) and the secondary-side pressure of the solid raw material, and characteristics data including the control limit range of the flow rate controller shown in FIG. 7.

The I/O port 121d is connected to the MFCs 96 and 99, the MFM 98, the valves v1 to v8 and 110, the APC valve 243, the pressure sensors 109 and 245, the vacuum pump 246, the heater 207, the sub-heater 70, the pipe heater 71, the rotator 267, the boat elevator 115, and so on.

The CPU 121a is configured to read and execute the control program from the memory 121c. The CPU 121a is also configured to read the process recipe from the memory 121c according to an input of an operation command from the input/output device 122. The CPU 121a is configured to control the flow rate regulating operation of various kinds of gases by the MFCs, the opening/closing operation of the valves, the opening/closing operation of the APC valve 243, the pressure regulating operation performed by the APC valve 243 based on the pressure sensor 245, the temperature regulating operation performed by the heater 207 based on the temperature sensor 263, the actuating and stopping operation of the vacuum pump 246, the operation of rotating the boat 217 with the rotator 267 and adjusting a rotation speed of the boat 217, the operation of moving the boat 217 up or down by the boat elevator 115, and so on, according to contents of the read process recipe. Further, in the embodiments of the present disclosure, the operations of the opening/closing valve 97 and the MFC 96, the MFC 99, the MFM 98, the pressure gauge 109, the valves v5 to v8, the supply valve 110, the sub-heater 70, the pipe heater 71, and so on which constitute the first solid raw material supply line and the second solid raw material supply line, respectively, are controlled.

The controller 121 is not limited to being constituted as a dedicated computer, and may be configured as a general-purpose computer. For example, the controller 121 of the embodiments of the present disclosure may be configured by providing an external memory (for example, a magnetic tape, a magnetic disk such as a flexible disk or a hard disk, an optical disc such as a CD or a DVD, a magneto-optical disc such as a MO, or a semiconductor memory such as a USB memory or a memory card) 123 that stores the aforementioned program and installing the program on the general-purpose computer by using the external memory 123. However, the supply of the program to the computer is not limited to supplying the program via the external memory 123. For example, the program may be provided by using communication means or unit such as the Internet or a dedicated line, instead of using the external memory 123. The memory 121c or the external memory 123 is configured as a computer-readable recording medium. Hereinafter, the memory 121c and the external memory 123 may be generally and simply referred to as a "recording medium." When the term "recording medium" is used herein, it may indicate a case of including the memory 121c, a case of including the external memory 123, or a case of including both the memory 121c and the external memory 123.

<Method of Processing Substrate>

Next, an example of processing a wafer 200 will be described. An example of forming a film on the wafer 200 will be described as an example of a process of manufacturing a semiconductor device. First, as described above, the boat 217 is charged with the wafer 200 and is loaded into the process chamber 201 (step S1 in FIG. 8). At this time, after the boat 217 is loaded into the process chamber 201, the pressure and temperature of the process chamber 201 are regulated (step S2 in FIG. 8). Next, four steps of film-forming steps 1 to 4 are sequentially executed.

Figure 8:
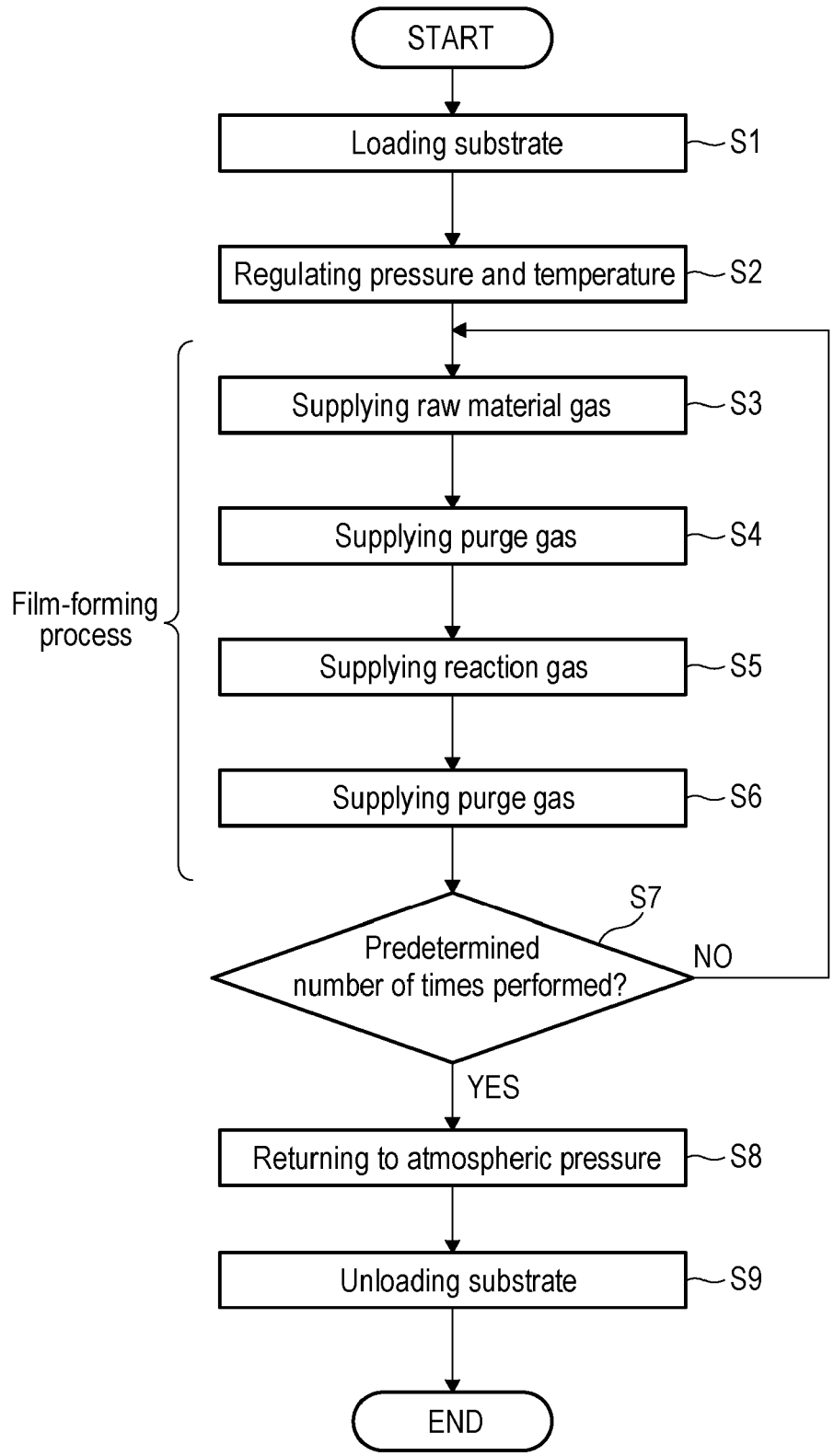
FIG. 8 is a flowchart of a substrate processing process according to the embodiments of the present disclosure.

In the process of the embodiments of the present disclosure, a film is formed on a wafer 200 by performing a cycle a predetermined number of times (one or more times), the cycle including non-simultaneously performing a step of supplying a precursor gas as a raw material gas to the wafer 200 in the process chamber 201 (film-forming step 1: step S3 in FIG. 8), a purging step of removing the raw material gas (residual gas) from the process chamber 201 (film-forming step 2: step S4 in FIG. 8), a step of supplying a nitrogen-containing gas to the wafer 200 in the process chamber 201 (film-forming step 3: step S5 in FIG. 8), and a purging step of removing the nitrogen-containing gas (residual gas) from the process chamber 201 (film-forming step 4: step S6 in FIG. 8).

Each step will be described in detail below with reference to FIG. 9.

(Film-Forming Step 1)

In film-forming step 1, first, before supplying the raw material gas, the controller 121 calculates the flow rate of the second precursor gas to be supplied to the second gas supply line to acquire the secondary-side pressure of the second solid raw material 50b of the second gas supply line at that time, and checks whether or not the pressure difference between the primary-side pressure of the MFC 99 installed at the first gas supply line and the secondary-side pressure of the second solid raw material 50b exceeds the control limit value of the MFC 99. This check may be performed during step S2 in FIG. 8 instead of the film-forming step 1.

After the above check, a precursor as a process gas is adsorbed on the surface of the wafer 200. Specifically, with the opening/closing valve 97 being open, in the first solid raw material supply line, while the secondary-side valve v7a and the supply valve 110a are opened, the first precursor gas generated from the first solid raw material 50a in the first raw material container 60a by heating the first sub-heater 70a, and a first pipe heater 71a is supplied into the process chamber 201 by the MFC 99. Further, in the second solid raw material supply line, in a state where the secondary-side valve v7b and the supply valve 110b are opened, the carrier gas whose flow rate is controlled by the MFC 96 is supplied while being heated by the second sub-heater 70b, and the second pipe heater 71b, and a mixture gas of the second precursor gas generated from the second solid raw material 50b in the second raw material container 60b and the carrier gas is supplied into the process chamber 201 while being monitored by the MFM 98. That is, a mixture gas of the first precursor gas, the second precursor gas, and the carrier gas is supplied into the process chamber 201.

(Film-Forming Step 2)

In film-forming step 2, at least the opening/closing valve 97 is closed to stop the supply of the first precursor gas, the second precursor gas, and the carrier gas. Specifically, in the first solid raw material supply line and the second solid raw material supply line, the secondary-side valve v7 is changed to a closed state. Alternatively, the supply valve 110 may be changed to a closed state. Further, the sub-heater 70, the pipe heater 71, and the MFCs 96 and 99 are kept on at least until the substrate processing process is completed. Further, the valve 243 of the exhaust pipe 231 is left open, and the process furnace 202 is exhausted to 20 Pa or less by the vacuum pump 246 to remove the residual mixed gas from the process chamber 201. In this operation, when an inert gas such as a $N_2$ gas used as a carrier gas is supplied to the process furnace 202, an effect of removing the residual raw material gas is further enhanced.

(Film-Forming Step 3)

In film-forming step 3, an oxygen-containing gas as a reaction gas is supplied. Specifically, the valve v3 installed at the branch pipe 82a of the first gas supply pipe 310 is opened, and the valve v4 installed at the branch pipe 82b is closed, such that the oxygen-containing gas whose flow rate is regulated by the MFC 84a from the first gas supply pipe 310 is supplied into the process chamber 201 from the first gas supply hole 410a of the first nozzle 410 and is exhausted via the exhaust pipe 231. By supplying the oxygen-containing gas, the film on the wafer 200 reacts with the oxygen-containing gas to form an oxide film on the wafer 200.

Further, when a nitrogen-containing gas is supplied as the reaction gas, the valve v1 installed at the branch pipe 72a of the second gas supply pipe 320 is opened, and the valve v2 installed at the branch pipe 72b is closed, such that the nitrogen-containing gas whose flow rate is regulated by the MFC 74a from the second gas supply pipe 320 is supplied into the process chamber 201 from the second gas supply hole 420a of the second nozzle 420 and is exhausted via the exhaust pipe 231. By supplying the nitrogen-containing gas, the film on the wafer 200 reacts with the nitrogen-containing gas to form a nitride film on the wafer 200. Similarly, when forming an oxynitride film, in this step, as the reaction gases, the oxygen-containing gas and the nitrogen-containing gas may be supplied from the first gas supply hole 410a of the first nozzle 410 and the second gas supply hole 420a of the second nozzle 420, respectively, as described above. For example, the oxygen-containing gas and the nitrogen-containing may be supplied simultaneously, or the oxygen-containing gas and the nitrogen-containing gas may be supplied respectively.

(Film-Forming Step 4)

In film-forming step 4, after the oxide film is formed, at least the valve v3 is closed, and the process chamber 201 is vacuum-exhausted by the vacuum pump 246 as the exhauster to remove the oxygen-containing gas remaining after contributing to the film formation. In this operation, by supplying an inert gas such as a $N_2$ gas used as a carrier gas into the process chamber 201, the effect of removing the residual oxygen-containing gas from the process chamber 201 may be further enhanced.

Then, with the above-described film-forming steps 1 to 4 as one cycle, in step S7 in FIG. 8, an oxide film with a predetermined thickness may be formed on the wafer 200 by performing the cycle of film-forming steps 1 to 4 a predetermined number of times. In the embodiments of the present disclosure, film-forming steps 1 to 4 are performed one or more times.

After the above-described film-forming process is completed, in step S8 in FIG. 8, the pressure of the process chamber 201 is returned to a normal pressure (atmospheric pressure). Specifically, for example, an inert gas such as a $N_2$ gas is supplied into the process chamber 201 and is exhausted. As a result, the process chamber 201 is purged with the inert gas to remove a gas and the like remaining in the process chamber 201 from the process chamber 201 (inert gas purge). Thereafter, the atmosphere of the process chamber 201 is substituted with the inert gas (inert gas substitution), and the pressure of the process chamber 201 is returned to the normal pressure (atmospheric pressure). Then, in step S9 in FIG. 8, when the wafer 200 is unloaded from the process chamber 201, the substrate processing according to the embodiments of the present disclosure is completed.

The embodiments of the present disclosure are configured to include the MFC 99 that controls the amount of the precursor gas as the raw material gas flowing through a supply pipe 310a, the first gas supply line configured to be capable of supplying the first precursor gas into the process chamber 201 by the MFC 99, the second gas supply line configured to be capable of supplying the mixture gas of the second precursor gas and the carrier gas into the process chamber 201, and the controller 121 configured to determine the flow rate of the second precursor gas by the pressure difference between the primary-side pressure of the MFC 99 installed at the first gas supply line (the supply pressure of the first precursor gas) and the secondary-side pressure of the second raw material container 60b (the supply pressure of the mixture gas of the second precursor gas and the carrier gas). Therefore, a plurality of raw material gases (precursor gases) may be simultaneously supplied into the process chamber 201 regardless of their respective vapor pressure characteristics. Further, in the embodiments of the present disclosure, the first precursor gas and the second precursor gas are supplied at the same time, however, it goes without saying that the present disclosure is applicable as long as the supply timings of the first precursor gas and the second precursor gas are at least partially simultaneous.

Further, in the embodiments of the present disclosure, in a case where a difference between the primary-side pressure of the MFC 99 and the downstream side pressure of the second solid raw material 50b is large, an inert gas may be supplied to the secondary side of the MFC 99. As a result, the controller 121 reduces the pressure difference (primary-side pressure P1-secondary-side pressure P2) so as not to exceed the control limit value of the MFC 99, thereby suppressing the influence of thermal expansion and thus making it possible to suppress re-solidification (or re-liquefaction) of the raw material.

The first solid raw material 50a and the second solid raw material 50b may be the same chlorides, carbides, oxides, and fluorides, respectively. Thus, the precursor gases generated by sublimating the respective solid raw materials may be mixed and supplied into the process chamber 201.

Next, an example of the film-forming process (a process corresponding to steps S3 to S6 in FIG. 8) will be described with reference to FIG. 10. The boat 217 is charged with the wafer 200 and is loaded into the process chamber 201, as described above. In this operation, after the boat 217 is loaded into the process chamber 201, the pressure and temperature of the process chamber 201 are regulated. These steps are the same as steps S1 and S2 in FIG. 8.

(Film-Forming Step 1)

A precursor as a raw material gas is adsorbed on the surface of the wafer 200. Specifically, with the opening/closing valve 97 being open, in the first solid raw material supply line, while the secondary-side valve v7a and the supply valve 110a are opened, the first precursor gas generated from the first solid raw material 50a in the first raw material container 60a by being heated by the first sub-heater 70a and the first pipe heater 71a is supplied into the process chamber 201 by the MFC 99.

(Film-Forming Step 2)

In film-forming step 2, at least the opening/closing valve 97 is closed to stop the supply of the first precursor gas. Specifically, in the first solid raw material supply line, the secondary-side valve v7a is changed to a closed state. Alternatively, the supply valve 110a may be changed to a closed state. The first sub-heater 70a, the first pipe heater 71a, and the MFCs 96 and 99 are kept on at least until the substrate processing process is completed. Further, the valve 243 of the exhaust pipe 231 is left open, and the process furnace 202 is exhausted to 20 Pa or less by the vacuum pump 246 to remove the residual mixed gas from the process chamber 201. In this operation, by supplying an inert gas such as a $N_2$ gas used as a carrier gas to the process furnace 202, the effect of removing the residual raw material gas is further enhanced.

(Film-Forming Step 3)

In film-forming step 3, an oxygen-containing gas is supplied as a reaction gas. Specifically, the valve v3 installed at the branch pipe 82a of the first gas supply pipe 310 is opened, the valve v4 installed at the branch pipe 82b is closed, and the oxygen-containing gas whose flow rate is regulated by the MFC 84a from the first gas supply pipe 310 is supplied into the process chamber 201 from the first gas supply hole 410a of the first nozzle 410 and is exhausted via the exhaust pipe 231. By supplying the oxygen-containing gas, the film on the wafer 200 reacts with the oxygen-containing gas to form an oxide film on the wafer 200.

(Film-Forming Step 4)

In film-forming step 4, after the oxide film is formed, at least the valve v3 is closed, and the process chamber 201 is vacuum-exhausted by the vacuum pump 246 as the exhauster to remove the oxygen-containing gas remaining after contributing to the film formation. Further, in this operation, by supplying an inert gas such as a $N_2$ gas used as a carrier gas into the process chamber 201, the effect of removing the residual oxygen-containing gas from the process chamber 201 is further enhanced.

(Film-Forming Step 5)

A second precursor gas is adsorbed on the surface of the wafer 200. Specifically, in the second solid raw material supply line, in a state where the secondary-side valve v7b and the supply valve 110b are opened, the carrier gas whose flow rate is controlled by the MFC 96 is supplied while being heated by the second sub-heater 70b and the second pipe heater 71b, and a mixture gas of the second precursor gas generated from the second solid raw material 50b in the second raw material container 60b and the carrier gas is supplied into the process chamber 201 while being monitored by the MFM 98. That is, a mixture gas of the second precursor gas and the carrier gas is supplied into the process chamber 201.

(Film-Forming Step 6)

In film-forming step 6, at least the opening/closing valve 97 is closed to stop the supply of the mixture gas of the second precursor gas and the carrier gas. Specifically, in the second solid raw material supply line, the secondary-side valve v7b is changed to a closed state. Alternatively, the supply valve 110b may be changed to a closed state. The second sub-heater 70b, the second pipe heater 71b, the MFC 96, and the MFM 98 are kept on at least until the substrate processing process is completed. Further, with the valve 243 of the exhaust pipe 231 left open, the process furnace 202 is exhausted to 20 Pa or less by the vacuum pump 246 to remove the residual mixture gas from the process chamber 201. In this operation, by supplying an inert gas such as a $N_2$ gas used as a carrier gas to the process furnace 202, the effect of removing the residual raw material gas is further enhanced.

(Film-Forming Step 7) (Film-Forming Step 8)

Since film-forming step 7 and film-forming step 8 are the same as film-forming step 3 and film-forming step 4, respectively, explanation thereof will be omitted.

Then, with the above-described film-forming steps 1 to 8 as one cycle, in step S7 in FIG. 8, a film with a predetermined thickness may be formed on the wafer 200 by performing the cycle of film-forming steps 1 to 8 a predetermined number of times. In the embodiments of the present disclosure, film-forming steps 1 to 8 are performed one or more times. Further, without being limited to the embodiments, a cycle of film-forming steps 1 to 4 may be performed a predetermined number of times, and a cycle of film-forming steps 5 to 8 may be performed a predetermined number of times.

After the above-described film-forming process is completed, in step S8 in FIG. 8, the pressure of the process chamber 201 is returned to the normal pressure (atmospheric pressure). Specifically, for example, an inert gas such as a $N_2$ gas is supplied into the process chamber 201 and is exhausted. As a result, the process chamber 201 is purged with the inert gas to remove a gas and the like remaining in the process chamber 201 from the process chamber 201 (inert gas purge). Thereafter, the atmosphere of the process chamber 201 is substituted with the inert gas (inert gas substitution), and the pressure of the process chamber 201 is returned to the normal pressure (atmospheric pressure). Then, in step S9 in FIG. 8, when the wafer 200 is unloaded from the process chamber 201, the substrate processing according to the embodiments of the present disclosure is completed.

(Flow Rate Control of Second Solid Raw Material Supply Line)

In the embodiments of the present disclosure, since the first solid raw material 50a and the second solid raw material 50b include a plurality of solid raw materials with different vapor pressure characteristics, for example, the first solid raw material 50a, which is relatively high in a vapor pressure, is heated by a sub-heater, which will be described later, to promote the sublimation reaction, making it possible to control the flow rate by the MFC 99, whereas the second solid raw material 50b, which is extremely low in the vapor pressure, may be heated by the sub-heater while a carrier gas that promotes the sublimation being supplied.

For example, the first solid raw material 50a may not be replaced until it is sublimated by the heating of the sub-heater to some extent, whereas when the amount of the second solid raw material 50b decreases, the flow rate of the second precursor gas may not be secured and, thus, a frequency of replacement is high. The controller 121 controls the flow rate of the second precursor gas in performing the above-described substrate processing process to extend a cycle of replacing the second solid raw material 50b.

Figure 11:
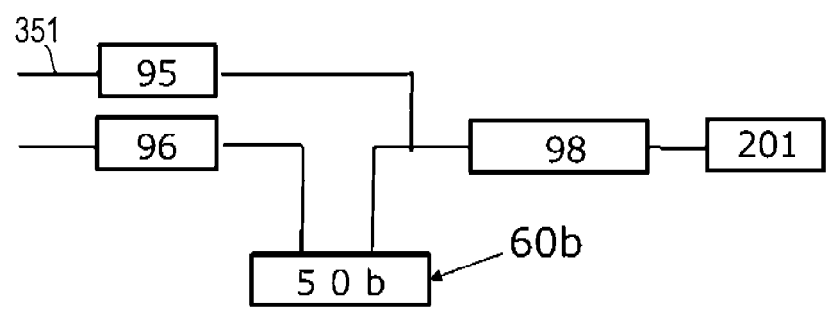
FIG. 11 is a diagram showing a modification of a second solid raw material supply system according to the embodiments of the present disclosure.

FIG. 11 shows a modification of the second precursor gas supply system 100b (the second solid raw material supply line). In particular, although the second precursor gas supply system 100b according to the modification is formed in the same structure as the second precursor gas supply system 100b (the second solid raw material supply line) shown in FIG. 4, a structure to be used for explanation is shown in FIG. 11, and a structure not to be used for explanation is omitted. A difference from the second precursor gas supply system 100b (the second solid raw material supply line) in FIG. 4 is to install a dilution gas line 351 at the raw material supply pipe 330b between the MFM 98 and the second raw material container 60b, and a flow rate of a dilution gas is controlled by the MFC 95. This dilution gas is also an inert gas like the carrier gas. Further, the dilution gas may be heated to the sublimation temperature of the second solid raw material 50b. As a result, re-solidification of the second dilution gas may be suppressed.

Figure 12:
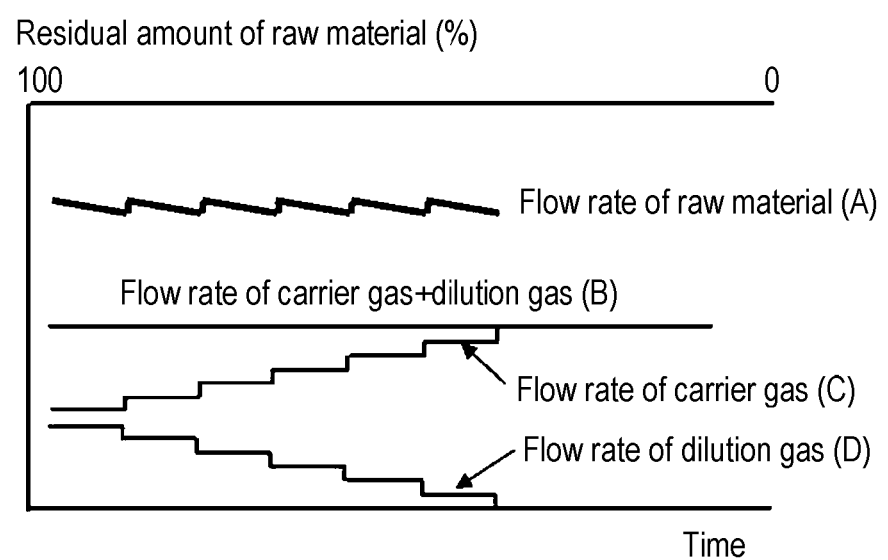
FIG. 12 is a diagram showing an example of gas flow rate control of a second solid raw material supply system according to the embodiments of the present disclosure.

In FIG. 12, the vertical axis represents a gas flow rate, the upper horizontal axis represents the remaining amount of the second solid raw material 50b, and the lower horizontal axis represents time. As shown in FIG. 12, changes in the flow rate of the second precursor gas and a total flow rate of the carrier gas and the dilution gas in the modification of the second solid raw material supply line may be seen.

By supplying this dilution gas, a mixture gas of the second precursor gas, the carrier gas, and the dilution gas is supplied into the process chamber 201 from the second solid raw material supply line in FIG. 11. According to such a configuration, by keeping the total flow rate of the carrier gas and the dilution gas constant, a fluctuation in the pressure on the output side of the second solid raw material 50b may be suppressed. Specifically, as shown in FIG. 12, by increasing the carrier gas by sublimation of the second solid raw material 50b while decreasing the flow rate of the dilution gas to keep the total flow rate of the carrier gas and the dilution gas constant, it is possible to eliminate an instability of the secondary-side pressure in the second solid raw material supply line due to the decrease in the second solid raw material 50b.

Further, as shown in FIG. 12, according to above-described feature of the embodiments, since the flow rate of the second precursor gas supplied to the second solid raw material supply line may be kept constant, check by a pressure difference between the primary-side pressure of the flow rate controller installed at the first solid raw material supply line and the secondary-side pressure of the second solid raw material supply line may be performed once before supplying the second precursor gas.

Although the constant flow rate of the second precursor gas obtained by regulating the flow rate of the dilution gas in FIG. 12 obtains a certain effect on the stable supply of the second precursor gas due to the constant pressure on the secondary side of the second solid raw material supply line, since the constant flow rate of the second precursor gas is regulated by the flow rate of the dilution gas, the constant flow rate of the second precursor gas may not be regulated when the flow rate of the dilution gas becomes zero as the carrier gas increases due to the decrease of the second solid raw material 50b. As a result, since the second solid raw material 50b may not be supplied at a predetermined flow rate, the second solid raw material 50b is replaced.

Figure 13:
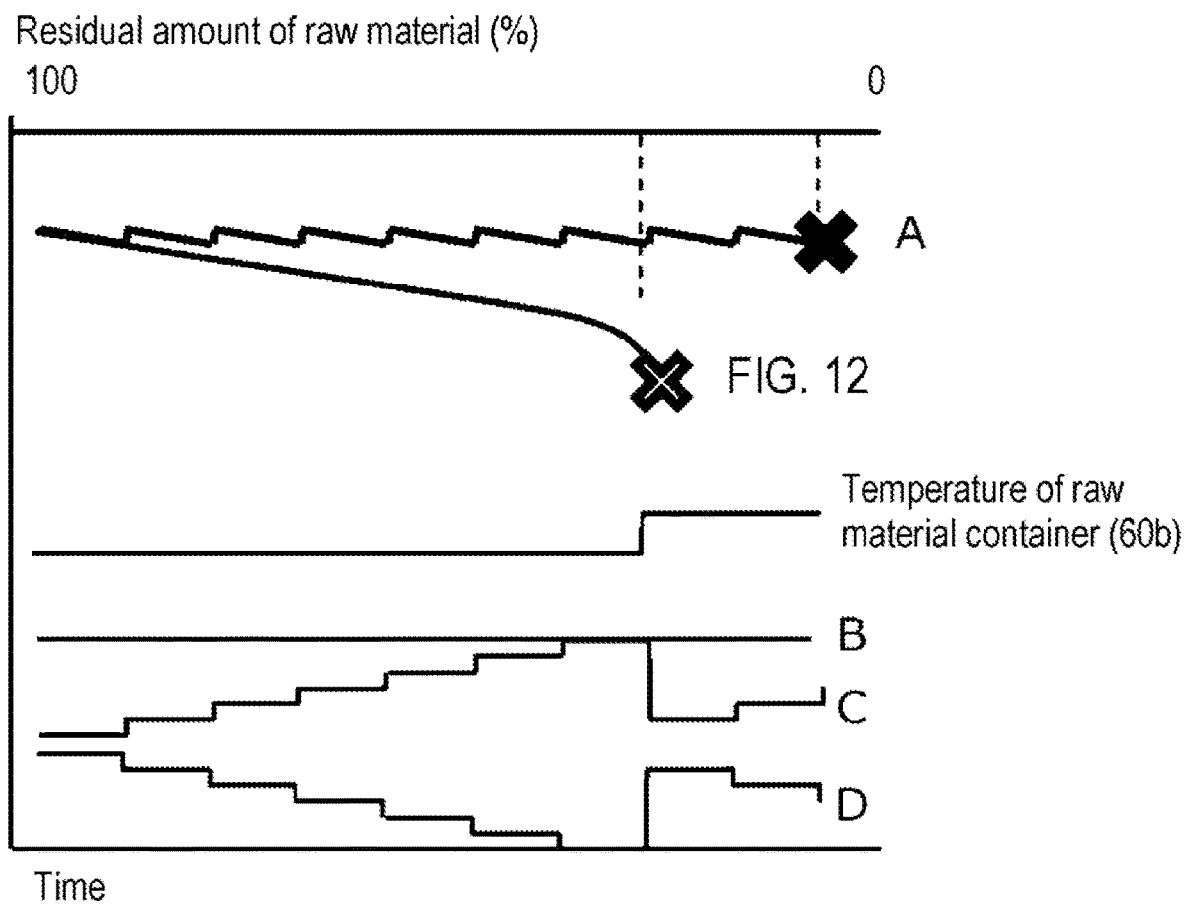
FIG. 13 is a diagram showing an example of gas flow rate control of a second solid raw material supply system according to the embodiments of the present disclosure.

As shown in FIG. 13, as a method of extending the replacement cycle of the second solid raw material 50b, when or immediately before the flow rate of the dilution gas becomes zero, the set temperature of the second sub-heater 70b is increased to promote the further sublimation of the second solid raw material 50b, and the total flow rate of the carrier gas and the dilution gas is regulated to be constant again. As a result, in FIG. 12, even in a case where there is a residual amount of the second solid raw material 50b, the second solid raw material 50b is replaced, but with the improvement shown in FIG. 13, it may be seen that the residual amount of the second solid raw material 50b may be used up to the last moment. Here, the "immediately before" the flow rate becomes zero refers to when the flow rate reaches a preset flow rate (threshold value) when the flow rate approaches zero.

Further, after increasing the set temperature of the second sub-heater 70b to stabilize the temperature, before supplying the first precursor gas or the second precursor gas, the check by the pressure difference between the primary-side pressure of the flow rate controller installed at the first solid raw material supply line and the secondary-side pressure of the second solid raw material supply line may be performed. As a result, the first precursor gas and the second precursor gas may be supplied simultaneously.

Further, the above feature may be applied to the first solid raw material 50a. For example, what amount of heat is used to eliminate the residual amount of the first solid raw material 50a is identified to set a predetermined threshold value in advance, and when a heating time of the first sub-heater 70a or a heating time of the first raw material container 60a reaches the threshold value, the set temperature of the first raw material container 60a may be increased. Further, for example, a weight scale may be installed at the first raw material container 60a with a predetermined threshold value being set, and when the residual amount of the first solid raw material 50a in the first raw material container 60a reaches the threshold value, the set temperature of the first raw material container 60a may be increased.

Further, during execution of the process recipe, the controller 121 may make the total flow rate of the carrier gas and the dilution gas constant while the wafer 200 is being processed (for example, during the film-forming steps 1 to 4), based on the preset flow rate of the second precursor gas and information from the pressure gauge 109, the MFM 98, and the MFCs 95 and 96. As a result, since the second precursor gas (actually the mixture gas of the second precursor gas, the carrier gas, and the dilution gas) may be stably supplied at a constant flow rate, it is possible to enhance the in-plane film thickness uniformity of wafer 200 and the film thickness uniformity among the wafers 200 and further improve the reproducibility.

Further, the threshold value is set at a value where the flow rate of the dilution gas is close to zero, and after the flow rate of the dilution gas reaches the threshold value and the process recipe under execution is completed, the set temperature of the second sub-heater 70b is increased to raise the temperature of the second raw material container 60b. In a case where the flow rate of the dilution gas reaches zero during the execution of the process recipe, the flow rate of the carrier gas is set to be equal to or higher than the constant flow rate described above. However, in this case, when the first precursor gas and the second precursor gas are simultaneously supplied, the check by the pressure difference between the primary-side pressure of the flow rate controller installed at the first solid raw material supply line and the secondary-side pressure of the second solid raw material supply line may be performed in advance before the supply. Thus, the process recipe under execution may be completed.

Then, before executing the next process recipe, the set temperature of the second sub-heater 70b is increased to raise the temperature of the second raw material container 60b. Thus, the sublimation of the second solid raw material 50b may be promoted and the total flow rate of the carrier gas and the dilution gas may be reset, making it possible to perform a regulation by the flow rate of the dilution gas. Further, since the flow rate of the second precursor gas is not stably generated while the temperature of the second raw material container 60b is not stable, the controller 121 is configured not to execute the process recipe before the temperature of the second raw material container 60b reaches the set temperature.

According to the embodiments of the present disclosure, the raw material supply system is capable of supplying a gas (precursor gas) obtained by sublimating a plurality of solid raw materials into the process chamber 201. The raw material supply system includes the first raw material supply line configured to be capable of supplying the first precursor gas into the process chamber 201 by the MFC 99 and the second raw material supply line configured to be capable of supplying the second precursor gas into the process chamber 201 while supplying the carrier gas (pressure-feeding gas). In the raw material supply system, since the flow rate of the second precursor gas supplied to the second raw material supply line is determined depending on the pressure difference between the primary-side pressure of the MFC 99 installed at the first raw material supply line and the supply pressure of the second precursor gas supplied from the second gas supply line into the process chamber 201, it is possible to supply the first precursor gas and the second precursor gas into the process chamber 201 at the same time.

Further, according to the embodiments of the present disclosure, since it is possible to supply the first precursor gas and the second precursor gas respectively, with the pressure difference between the primary-side pressure of the MFC 99 and the secondary-side pressure of the second raw material container 60b being within a control range of the MFC 99, it is possible to stably supply the first precursor gas and the second precursor gas at respective preset flow rates.

Further, according to the embodiments of the present disclosure, the total flow rate of the carrier gas and the dilution gas may be made constant to supply the second precursor gas constantly and stably, and therefore it is possible to prevent pressure interference between the first raw material supply line and the second raw material supply line.

Further, according to the embodiments of the present disclosure, before the total flow rate of the carrier gas and the dilution gas may not be kept constant with the pressure difference between the primary-side pressure of the MFC 99 and the secondary-side pressure of the second raw material supply line being within the control range of the MFC 99, the set temperature of the second raw material container 60b may be increased to promote the sublimation of the second solid raw material 50b. As a result, since the total flow rate of the carrier gas and the dilution gas is kept constant again, it is possible to stabilize the flow rate of the second precursor gas.

Further, according to the embodiments of the present disclosure, a plurality of raw materials with different flow rate control methods may be supplied in one supply line (supply system). Accordingly, for example, when two raw materials (raw material A and raw material B) with different vapor pressure characteristics are used, supply lines (supply systems) may not be constructed for the raw material A and the raw material B respectively, thereby reducing time and cost when performing a remodeling.

Further, according to the embodiments of the present disclosure, it is possible to extend a replacement cycle of a raw material with such a low vapor pressure that the flow rate of the raw material to be used in substrate processing may not be ensured by heating the raw material alone, by raising a temperature of the raw material stepwise.

OTHER EMBODIMENTS

Although the embodiments of the present disclosure are specifically described above, the present disclosure is not limited to the above-described embodiments, and may be modified in various ways without departing from the gist of the present disclosure.

Further, although the case where a plurality of solid raw materials are provided at the raw material supply system 100 is exemplified above, the present disclosure is not limited thereto. A precursor that is liquid or gas at the room temperature may be connected. Further, a pressure gauge may be installed at the raw material supply pipe 330a on the upstream side of the MFC 99 to measure the supply pressure P1 of the first precursor gas from the first raw material container 60a. Further, the MFM 98 may be replaced with a densitometer (IR).

Further, according to the embodiments of the present disclosure, although the sub-heater 70 is installed to cover the raw material container 60, the sub-heater 70 may be installed at a side (for example, a lower side) of the raw material container 60 to raise an internal temperature of the raw material container 60. Further, the sub-heater 70 may be installed at each of the upper and lower sides of the raw material container 60 to heat the raw material container 60.

As a solid raw material containing a metal element and not containing carbon (C), hafnium tetrachloride ($HfCl_4$) or aluminum trichloride ($AlCl_3$) as a halogen-based raw material, which is an inorganic metal-based raw material (inorganic metal compound), may be used. Alternatively, it may be an organic metal-based raw material. The halogen-based raw material is a raw material containing a halogen group. The halogen group includes a chloro group, a fluoro group, a bromo group, an iodo group, and the like. That is, the halogen group includes halogen elements such as chlorine (Cl), fluorine (F), bromine (Br), and iodine (I).

As the nitrogen-containing gas, one or more selected from the group of a nitrous oxide ($N_2O$) gas, a nitric oxide (NO) gas, a nitrogen dioxide ($NO_2$) gas, an ammonia ($NH_3$) gas, and the like may be used. As the oxygen-containing gas, one or more selected from the group of an oxygen ($O_2$) gas, an ozone ($O_3$) gas, and the like may be used.

Further, the reactant is not limited to the nitrogen-containing gas or the oxygen-containing gas. For example, as the reactant, a gas that reacts with a source to perform film processing may be used to form a different type of thin film. Further, the film-forming process may be performed by using three or more types of process gases.

Further, for example, in each of the above-described embodiments of the present disclosure, the film-forming process in the semiconductor device is taken as an example of the process performed by the substrate processing apparatus, but the present disclosure is not limited thereto. For example, in addition to the film-forming process, the process performed by the substrate processing apparatus may be a process of forming an oxide film or a nitride film, or a process of forming a film containing metal. Further, regardless of specific contents of the substrate processing, the present disclosure may be suitably applied to other substrate processing such as annealing, oxidation, nitridation, diffusion, lithography, and the like as well as to the film-forming process.

Further, the present disclosure may also be suitably applied to other substrate processing apparatuses such as an annealing apparatus, an oxidation apparatus, a nitridation apparatus, an exposure apparatus, a coating apparatus, a drying apparatus, a heating apparatus, a plasma processing apparatus, and the like. Further, the present disclosure may be suitably applied to a mixture of these apparatuses.

Further, in the embodiments of the present disclosure, although the semiconductor manufacturing process is described above, the present disclosure is not limited thereto. For example, the present disclosure may also be applied to substrate processing such as a process of manufacturing a liquid crystal apparatus, a solar cell manufacturing process, a light-emitting apparatus manufacturing process, a glass substrate processing process, a ceramic substrate processing process, and a conductive substrate processing process.

Further, a portion of structures of some embodiments of the present disclosure may be replaced with configurations of other embodiments of the present disclosure, and configurations of some embodiments of the present disclosure may be added to configurations of other embodiments of the present disclosure. Further, it is also possible to add, delete, or replace a portion of the structures of the respective embodiments of the present disclosure with other configurations.

Further, in the above-described embodiments of the present disclosure, an example of using the $N_2$ gas as the inert gas is described above, but the present disclosure is not limited thereto. For example, a rare gas such as an Ar gas, a He gas, a Ne gas, and a Xe gas may be used as the inert gas. However, in this case, a rare gas source may be provided. Further, the rare gas source may be connected to the third gas supply pipe 330 such that the rare gas may be introduced.

According to the present disclosure in some embodiments, it is possible to stably supply a plurality of raw materials in one raw material supply system.

While certain embodiments are described above, these embodiments are presented by way of example, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A raw material supply system capable of supplying a plurality of raw materials into a process chamber, comprising:
   a first gas supply line configured to be capable of controlling a flow rate of a first precursor gas, which is generated by a first raw material, by a flow rate controller, and supplying the first precursor gas into the process chamber; and
   a second gas supply line configured to be capable of supplying a second precursor gas, which is generated by a second raw material, into the process chamber,
   wherein a flow rate of the second precursor gas is determined based on a pressure difference between a primary-side pressure of the flow rate controller installed at the first gas supply line and a supply pressure of the second precursor gas from the second gas supply line into the process chamber.

2. The raw material supply system of claim 1, wherein the pressure difference is regulated to fall within a control range of the flow rate controller.

3. The raw material supply system of claim 1,
   wherein the raw material supply system further comprises a second raw material container configured to store the second raw material, and a supply pipe configured to supply a carrier gas into the second raw material container, and
   wherein the flow rate of the second precursor gas is capable of being made constant by changing a flow rate of the carrier gas.

4. The raw material supply system of claim 1,
   wherein the raw material supply system further comprises an opening/closing valve configured to supply the plurality of raw materials into the process chamber, and
   wherein the first gas supply line and the second gas supply line are connected immediately before the opening/closing valve.

5. The raw material supply system of claim 3, further comprising a flow rate monitor installed in the downstream of the second raw material container,
   wherein the flow rate monitor is configured to detect a flow rate of a mixture gas of the second precursor gas and the carrier gas.

6. The raw material supply system of claim 1, wherein each of the first raw material and the second raw material is solid in room temperature.

7. The raw material supply system of claim 1,
   wherein the raw material supply system further comprises a first raw material container configured such that the first raw material is placed in the first raw material container,
   wherein the first raw material container includes a first heater configured to heat the first raw material, and
   wherein a temperature of the first raw material container is capable of being controlled to be equal to or higher than a sublimation temperature of the first raw material by the heating of the first heater.

8. The raw material supply system of claim 1,
   wherein the raw material supply system further comprises a first pipe heater configured to heat a first raw material supply pipe configured to supply the first raw material, and the flow rate controller, and
   wherein the first pipe heater is configured to heat the first raw material supply pipe and the flow rate controller to the sublimation temperature or higher.

9. The raw material supply system of claim 1,
   wherein the raw material supply system further comprises a second raw material container configured such that the second raw material is placed in the second raw material container,
   wherein the second raw material container includes a second heater configured to heat the second raw material, and
   wherein a temperature of the second raw material container is capable of being controlled to be equal to or higher than a sublimation temperature of the second raw material by the heating of the second heater.

10. The raw material supply system of claim 5,
    wherein the raw material supply system further comprises a second pipe heater configured to heat a second raw material supply pipe, which is configured to supply the second raw material, and the flow rate monitor, and
    wherein the second pipe heater is configured to heat the second raw material supply pipe and the flow rate monitor at least to the sublimation temperature or higher.

11. The raw material supply system of claim 1, wherein the second raw material is lower in a vapor pressure than the first raw material.

12. The raw material supply system of claim 9,
    wherein the raw material supply system further comprises a pipe configured to supply a dilution gas and connected to a secondary side of the second raw material container, and
    wherein the second raw material is sublimated based on a temperature of the second raw material container while a total flow rate of the flow rate of the carrier gas and a flow rate of the dilution gas is kept constant.

13. The raw material supply system of claim 12, wherein the flow rate of the carrier gas is increased and the flow rate of the dilution gas is decreased in response to a decrease in a flow rate of a gas obtained by sublimating the second raw material in the second raw material container.

14. The raw material supply system of claim 12, wherein the temperature of the second raw material container is raised when the flow rate of the dilution gas approaches zero or when the flow rate of the dilution gas is zero.

15. The raw material supply system of claim 14, wherein a temperature of a portion of the second raw material container is raised.

16. The raw material supply system of claim 1, further comprising a memory configured to store characteristic data including a control limit range of the flow rate controller.

17. A processing apparatus including a raw material supply system capable of supplying a plurality of raw materials into a process chamber, comprising:
   a first gas supply line configured to be capable of controlling a flow rate of a first precursor gas, which is generated by a first raw material, by a flow rate controller, and supplying the first precursor gas into the process chamber; and
   a second gas supply line configured to be capable of supplying a second precursor gas, which is generated by a second raw material, into the process chamber,
   wherein a flow rate of the second precursor gas is determined based on a pressure difference between a primary-side pressure of the flow rate controller installed at the first gas supply line and a supply pressure of the second precursor gas from the second gas supply line into the process chamber.

18. A method of manufacturing a semiconductor device by using a raw material supply system capable of supplying a plurality of raw materials into a process chamber,
   wherein the raw material supply system includes: a first gas supply line configured to be capable of controlling a flow rate of a first precursor gas, which is generated by a first raw material, by a flow rate controller, and supplying the first precursor gas into the process chamber, and a second gas supply line configured to be capable of supplying a second precursor gas, which is generated by a second raw material, into the process chamber,
   wherein a flow rate of the second precursor gas is determined based on a pressure difference between a primary-side pressure of the flow rate controller installed at the first gas supply line and a supply pressure of the second precursor gas from the second gas supply line into the process chamber, and
   wherein the method comprises processing a substrate placed in the process chamber by supplying at least the first precursor gas and the second precursor gas into the process chamber.

\* \* \* \* \*